United States Patent
Po

(10) Patent No.: US 9,520,196 B1
(45) Date of Patent: Dec. 13, 2016

(54) VOLTAGE SWITCH CIRCUIT

(71) Applicant: eMemory Technology Inc., Hsin-Chu (TW)

(72) Inventor: Chen-Hao Po, Hsinchu (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 15/152,047

(22) Filed: May 11, 2016

Related U.S. Application Data

(60) Provisional application No. 62/280,683, filed on Jan. 19, 2016.

(51) Int. Cl.
| | |
|---|---|
| G11C 16/12 | (2006.01) |
| G11C 16/14 | (2006.01) |
| G11C 16/26 | (2006.01) |
| G11C 16/30 | (2006.01) |

(52) U.S. Cl.
CPC .............. *G11C 16/12* (2013.01); *G11C 16/14* (2013.01); *G11C 16/26* (2013.01); *G11C 16/30* (2013.01)

(58) Field of Classification Search
CPC ......... G11C 16/12; G11C 16/14; G11C 16/26; G11C 16/30
See application file for complete search history.

(56) References Cited

U.S. PATENT DOCUMENTS

| | | | | |
|---|---|---|---|---|
| 6,060,904 A | * | 5/2000 | Shimoda | H03K 3/356113 326/115 |
| 6,370,071 B1 | * | 4/2002 | Lall | G11C 8/08 326/81 |
| 8,218,377 B2 | * | 7/2012 | Tandon | G11C 5/147 327/333 |
| 8,461,899 B2 | * | 6/2013 | Rana | H03K 3/356165 326/61 |
| 9,224,490 B1 | | 12/2015 | Po | |

* cited by examiner

*Primary Examiner* — Vanthu Nguyen
(74) *Attorney, Agent, or Firm* — WPAT, PC; Justin King

(57) ABSTRACT

A voltage switch circuit is connected to a memory cell of a non-volatile memory. When the non-volatile memory is in a program mode and the memory cell is a selected memory cell, two output terminals provide a high voltage. When the non-volatile memory is in the program mode and the memory cell is a non-selected memory cell, the two output terminals provide a medium voltage and a ground voltage. When the non-volatile memory is in an erase mode and the memory cell is the selected memory cell, the two output terminals provide the high voltage and the ground voltage. When the non-volatile memory is in the erase mode and the memory cell is the non-selected memory cell, the two output terminals provide the ground voltage. When the non-volatile memory is in a read mode, the two output terminals provide a read voltage.

19 Claims, 3 Drawing Sheets

FIG. 1B

| Mode | Selection | En | Vpp1 | Vpp2 | Vpp3 | Vpp4 | Vc4 | Vc3 | Vc2 | Vc1 | a2 | a1 | b2 | b1 | CL | EL | In1 | In1b | Ers | Ersb | Rd |
|---|---|---|---|---|---|---|---|---|---|---|---|---|---|---|---|---|---|---|---|---|---|
| Program mode | Selected | Ven | VPP | VM | Vctrl | VM | Vh | Vh | Vh | Vh | VPP | VPP | VPP | VPP | VPP | VPP | VDD | 0 | 0 | VDD | 0 |
| Program mode | Non-selected | Vdis | VPP | 0V | Vctrl | VM | Vl | Vl | Vl | Vl | Vbias | Vbias | Vbias | Vbias | VPP | VPP | 0 | VDD | 0 | VDD | 0 |
| Erase mode | Selected | Ven | VPP | VM | Vctrl | VM | Vh | Vh | Vh | Vh | VM | VM | FL | FL | 0 | VPP | VDD | 0 | VDD | 0 | 0 |
| Erase mode | Non-selected | Vdis | VPP | 0V | Vctrl | VM | Vl | Vl | Vl | Vl | Vbias | Vbias | Vbias | Vbias | 0 | VPP | 0 | VDD | VDD | 0 | 0 |
| Read mode | Selected | VDD | VDD | VDD | VDD | 0V | FL | FL | FL | FL | FL | FL | FL | FL | VPR | VPR | VDD | 0 | 0 | VDD | VDD |
| Read mode | Non-selected | VDD | VDD | VDD | VDD | 0V | FL | FL | FL | FL | FL | FL | FL | FL | VPR | VPR | VDD | 0 | 0 | VDD | VDD |

US 9,520,196 B1

VOLTAGE SWITCH CIRCUIT

This application claims the benefit of U.S. provisional application Ser. No. 62/280,683, filed Jan. 19, 2016, the subject matter of which is incorporated herein by reference.

FIELD OF THE INVENTION

The present invention relates to a voltage switch circuit, and more particularly to a voltage switch circuit for a non-volatile memory.

BACKGROUND OF THE INVENTION

As is well known, a non-volatile memory is able to continuously retain data after the supplied power is interrupted. Consequently, the non-volatile memory is widely used in a variety of electronic products. Generally, the non-volatile memory comprises a memory cell array. The memory cell array consists of plural memory cells. In addition, each memory cell has a floating gate transistor.

In a program mode, a high voltage is received by the memory cell array. Consequently, hot carriers are injected into the floating gate of the floating gate transistor of a selected memory cell.

Moreover, in an erase mode, the high voltage is also received by the memory cell array. Consequently, the hot carriers are rejected from the floating gate of the floating gate transistor of the selected memory cell.

That is, in the program mode and the erase mode, the high voltage is received by the memory cell array to control the hot carriers to be injected into or rejected from the floating gate of the floating gate transistor. Consequently, the non-volatile memory has a voltage switch circuit for providing different operating voltages to the memory cell array according to different operating modes.

Generally, the above high voltage (e.g. 18V) is much higher than the voltage level (e.g. 5V, 3.3V or 1.8V) of the general logic circuit. Consequently, the voltage switch circuit should be specially designed in order to be applied to the non-volatile memory. For example, a voltage switch circuit for a non-volatile memory is disclosed in U.S. Pat. No. 9,224,490.

SUMMARY OF THE INVENTION

The present invention provides a voltage switch circuit for providing different operating voltages to a memory cell array of a non-volatile memory according to different operating modes.

An embodiment of the present invention provides a voltage switch circuit. The voltage switch circuit is connected to a memory cell of a non-volatile memory. The voltage switch circuit includes a first transistor, a second transistor, a third transistor, a fourth transistor, a fifth transistor, a sixth transistor, a seventh transistor, a first control circuit and a second control circuit. A source terminal of the first transistor is connected to a first voltage source, and a gate terminal of the first transistor is connected to a node a1. A source terminal of the second transistor is connected to the first voltage source, and a gate terminal of the second transistor is connected to a node b1. A source terminal of the third transistor is connected to a drain terminal of the first transistor, a gate terminal of the third transistor receives an enabling signal, and a drain terminal of the third transistor is connected to a node a2. A source terminal of the fourth transistor is connected to a drain terminal of the second transistor, a gate terminal of the fourth transistor receives the enabling signal, and a drain terminal of the fourth transistor is connected to a node b2. A source terminal of the fifth transistor is connected to the node a2, a gate terminal of the fifth transistor is connected to a second voltage source, and a drain terminal of the fifth transistor is connected to a first output terminal. A source terminal of the sixth transistor is connected to the node b2, a gate terminal of the sixth transistor is connected to a third voltage source, and a drain terminal of the sixth transistor is connected to a second output terminal. A source terminal of the seventh transistor is connected to a fourth voltage source, a gate terminal of the seventh transistor is connected to the second output terminal, and a drain terminal of the seventh transistor is connected to the node a2. The first control circuit is connected to the node a1, the node b1 and the node a2. The second control circuit is connected to the first output terminal and the second output terminal. In a program mode and an erase mode of the non-volatile memory, the first voltage source provides a high voltage, the second voltage source provides a medium voltage or a ground voltage, the third voltage source provides a control voltage, and the fourth voltage source provides the medium voltage. In a read mode of the non-volatile memory, all of the first voltage source, the second voltage source and the third voltage source provide a high logic level voltage, and the fourth voltage source provides the ground voltage. In addition, the high voltage is higher than the medium voltage, the medium voltage is higher than the high logic level voltage, and the control voltage is in a range between the medium voltage and the high voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1B is a table illustrating associated operating voltages of the voltage switch circuit of FIG. 1A in different operating modes.

DETAILED DESCRIPTION OF PREFERRED EMBODIMENTS

Figure 1A:
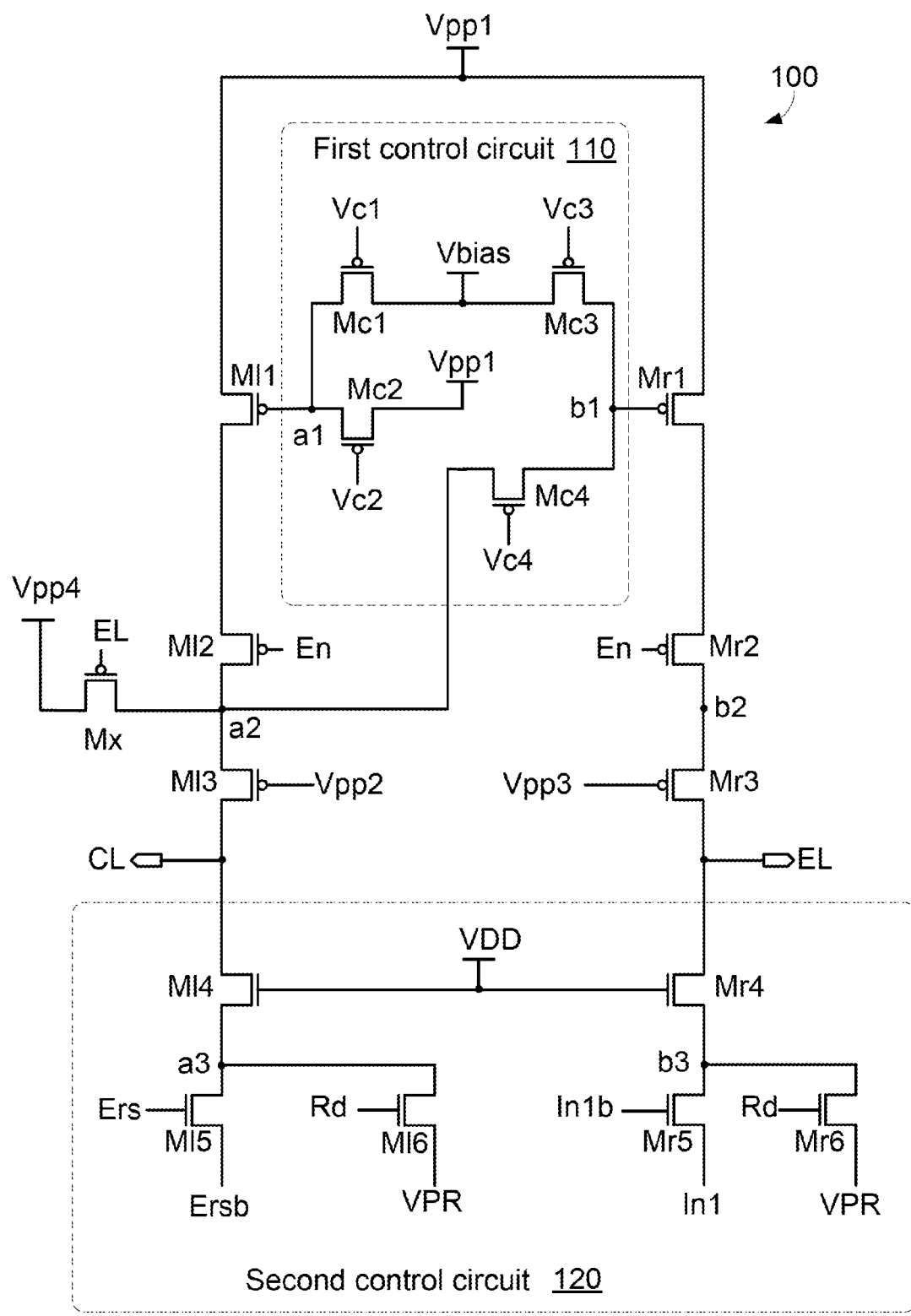
FIG. 1A is a schematic circuit diagram illustrating a voltage switch circuit according to a first embodiment of the present invention.

FIG. 1A is a schematic circuit diagram illustrating a voltage switch circuit according to a first embodiment of the present invention. As shown in FIG. 1A, a first output terminal CL and a second output terminal EL of the voltage switch circuit 100 are connected to memory cells of a non-volatile memory (not shown). According to the operating mode of the non-volatile memory, corresponding operating voltages are outputted from the two output terminals CL and EL of the voltage switch circuit 100 to the non-volatile memory.

The voltage switch circuit 100 comprises a first control circuit 110, a second control circuit 120, and plural p-type transistors MI1, MI2, MI3, Mr1, Mr2, Mr3 and Mx. The first control circuit 110 comprises plural p-type transistors Mc1, Mc2, Mc3 and Mc4. The second control circuit 120 comprises two n-type lightly doped transistors MI4 and Mr4 and plural n-type transistors MI5, MI6, Mr5 and Mr6. The n-type lightly doped transistors MI4 and Mr4 can withstand high voltages.

The source terminal of the transistor MI1 is connected to a first voltage source Vpp1. The gate terminal of the transistor MI1 is connected to a node a1. The source terminal of the transistor MI2 is connected to the drain terminal of the transistor MI1. The gate terminal of the transistor MI2 receives an enabling signal En. The drain terminal of the transistor MI2 is connected to a node a2. The source terminal of the transistor MI3 is connected to the node a2. The gate terminal of the transistor MI3 is connected to a second voltage source Vpp2. The drain terminal of the transistor MI3 is connected to the first output terminal CL.

The source terminal of the transistor Mr1 is connected to the first voltage source Vpp1. The gate terminal of the transistor Mr1 is connected to a node b1. The source terminal of the transistor Mr2 is connected to the drain terminal of the transistor Mr1. The gate terminal of the transistor Mr2 receives the enabling signal En. The drain terminal of the transistor Mr2 is connected to a node b2. The source terminal of the transistor Mr3 is connected to the node b2. The gate terminal of the transistor Mr3 is connected to a third voltage source Vpp3. The drain terminal of the transistor Mr3 is connected to the second output terminal EL.

The source terminal of the transistor Mx is connected to a fourth voltage source Vpp4. The drain terminal of the transistor Mx is connected to the node a2. The gate terminal of the transistor Mx is connected to the second output terminal EL.

The first control circuit 110 comprises the plural p-type transistors Mc1, Mc2, Mc3 and Mc4. The source terminal of the transistor Mc1 receives a bias voltage Vbias. The gate terminal of the transistor Mc1 receives a first control signal Vc1. The drain terminal of the transistor Mc1 is connected to the node a1. The source terminal of the transistor Mc2 is connected to the first voltage source Vpp1. The gate terminal of the transistor Mc2 receives a second control signal Vc2. The drain terminal of the transistor Mc2 is connected to the node a1. The source terminal of the transistor Mc3 receives the bias voltage Vbias. The gate terminal of the transistor Mc3 receives a third control signal Vc3. The drain terminal of the transistor Mc3 is connected to the node b1. The source terminal of the transistor Mc4 is connected to the node a2. The gate terminal of the transistor Mc4 receives a fourth control signal Vc4. The drain terminal of the transistor Mc4 is connected to the node b1.

The second control circuit 120 comprises the two n-type lightly doped transistors MI4 and Mr4 and the plural n-type transistors MI5, MI6, Mr5 and Mr6. The drain terminal of the transistor MI4 is connected to the first output terminal CL. The gate terminal of the transistor MI4 receives a high logic level voltage VDD. The source terminal of the transistor MI4 is connected to a node a3. The drain terminal of the transistor MI5 is connected to the node a3. The gate terminal of the transistor MI5 receives an erase signal Ers. The source terminal of the transistor MI5 receives an inverted erase signal Ersb. The drain terminal of the transistor MI6 is connected to the node a3. The gate terminal of the transistor MI6 receives a read signal Rd. The source terminal of the transistor MI6 receives a read voltage VPR. The drain terminal of the transistor Mr4 is connected to the second output terminal EL. The gate terminal of the transistor Mr4 receives the high logic level voltage VDD. The source terminal of the transistor Mr4 is connected to a node b3. The drain terminal of the transistor Mr5 is connected to the node b3. The gate terminal of the transistor Mr5 receives an inverted first input signal In1b. The source terminal of the transistor Mr5 receives the first input signal In1. The drain terminal of the transistor Mr6 is connected to the node b3. The gate terminal of the transistor Mr6 receives the read signal Rd. The source terminal of the transistor Mr6 receives the read voltage VPR.

In this embodiment, each of the first input signal In1, the erase signal Ers and the read signal Rd of the second control circuit 120 is in the range between a low logic level voltage (e.g. 0V) and the high logic level voltage VDD (e.g. 3.3V).

Moreover, each of the first control signal Vc1, the second control signal Vc2, the third control signal Vc3 and the fourth control signal Vc4 of the first control circuit 110 is in the range between a first level voltage Vh and a second level voltage Vl. Both of the first level voltage Vh and the second level voltage Vl are not logic level voltages. Moreover, the magnitude of the first level voltage Vh is higher than the magnitude of the second level voltage Vl, and the magnitude of the second level voltage Vl is higher than the magnitude of the high logic level voltage VDD.

FIG. 1B is a table illustrating associated operating voltages of the voltage switch circuit of FIG. 1A in different operating modes. In a program mode and an erase mode of the non-volatile memory, the first voltage source Vpp1 of the voltage switch circuit 100 provides a high voltage VPP, the second voltage source Vpp2 of the voltage switch circuit 100 provides a medium voltage VM or a ground voltage (0V), the third voltage source Vpp3 of the voltage switch circuit 100 provides a control voltage Vctrl, and the fourth voltage source Vpp4 of the voltage switch circuit 100 provides the medium voltage VM. In a read mode of the non-volatile memory, each of the first voltage source Vpp1, the second voltage source Vpp2 and the third voltage source Vpp3 of the voltage switch circuit 100 provides the high logic level voltage VDD. Moreover, the fourth voltage source Vpp4 of the voltage switch circuit 100 provides the ground voltage (0V). The magnitude of the high voltage VPP is higher than the magnitude of the medium voltage VM, and the magnitude of the medium voltage VM is higher than the magnitude of the high logic level voltage VDD. Moreover, the magnitude of the control voltage Vctrl is in the range between the medium voltage VM and the high voltage VPP. For example, the magnitude of the high voltage VPP is 20V, the magnitude of the control voltage Vctrl is 14V, the magnitude of the medium voltage VM is 8V, and the high logic level voltage VDD is 3.3V.

When the non-volatile memory is in the program mode and the voltage switch circuit 100 is connected to a selected memory cell, the enabling signal En has an enabling voltage Ven. Consequently, the transistor MI2 and the transistor Mr2 are turned on. Since the second voltage source Vpp2 provides the medium voltage VM, the transistor MI3 is turned on. Moreover, since the third voltage source Vpp3 provides the control voltage Vctrl, the transistor Mr3 is turned on. In addition, the magnitude of the enabling voltage Ven is lower than the magnitude of the high voltage VPP.

Moreover, the first control signal Vc1, the second control signal Vc2, the third control signal Vc3 and the fourth control signal Vc4 of the first control circuit 110 have the second level voltage Vl, the first level voltage Vh, the second level voltage Vl and the first level voltage Vh, respectively. Consequently, the transistor Mc1 and the transistor Mc3 are turned on, and the transistor Mc2 and the transistor Mc4 are turned off. Under this circumstance, the bias voltage Vbias is received by the node a1 and the node b1, and thus the transistor MI1 and the transistor Mr1 are turned on. Moreover, the magnitude of the second level voltage Vl is lower than the magnitude of the first level voltage Vh, the magnitude of the first level voltage Vh is lower than or equal to the magnitude of the high voltage VPP, and the magnitude of the bias voltage Vbias is lower than the magnitude of the high voltage VPP.

Moreover, the first input signal In1, the erase signal Ers and the read signal Rd of the second control circuit 120 have the high logic level voltage VDD, the low logic level voltage (e.g. 0V) and the low logic level voltage (e.g. 0V), respectively. Consequently, all of the transistors MI5, MI6, Mr5 and Mr6 are turned off. Under this circumstance, the second control circuit 120 is inactivated.

As mentioned above, when the non-volatile memory is in the program mode and the voltage switch circuit 100 is connected to the selected memory cell, the transistors MI1, MI2, MI3, Mr1, Mr2 and Mr3 are turned on. Consequently, the high voltage VPP is provided to the node a2, the node b2, the first output terminal CL and the second output terminal EL. In other words, the high voltage VPP outputted from the first output terminal CL and the high voltage VPP outputted from the second output terminal EL are used as the operating voltages of the selected memory cell. Moreover, since the second output terminal EL has the high voltage VPP, the transistor Mx is turned off.

On the other hand, when the non-volatile memory is in the program mode and the voltage switch circuit 100 is connected to a non-selected memory cell, the enabling signal En has a disabling voltage Vdis. Consequently, the transistor MI2 and the transistor Mr2 are turned off. Since the second voltage source Vpp2 provides the ground voltage (0V), the transistor MI3 is turned on. In this embodiment, the magnitude of the enabling voltage Ven is lower than the magnitude of the disabling voltage Vdis, and the magnitude of the disabling voltage Vdis is lower than or equal to the magnitude of the high voltage VPP.

Moreover, the first control signal Vc1, the second control signal Vc2, the third control signal Vc3 and the fourth control signal Vc4 of the first control circuit 110 have the second level voltage Vl, the first level voltage Vh, the second level voltage Vl and the first level voltage Vh, respectively. Consequently, the transistor Mc1 and the transistor Mc3 are turned on, and the transistor Mc2 and the transistor Mc4 are turned off. Under this circumstance, the bias voltage Vbias is received by the node a1 and the node b1, and thus the transistor MI1 and the transistor Mr1 are turned on.

Moreover, all of the first input signal In1, the erase signal Ers and the read signal Rd of the second control circuit 120 have the low logic level voltage (e.g. 0V). Consequently, in the second control circuit 120, only the transistor Mr5 is turned on. Under this circumstance, the ground voltage (0V) is provided to the second output terminal EL. Moreover, since the third voltage source Vpp3 provides the control voltage Vctrl, the transistor Mr3 is turned off and the node b2 is in the floating state FL. Since the second output terminal EL has the ground voltage (0V), the transistor Mx is turned on. Moreover, since the second voltage source Vpp2 provides the ground voltage (0V), the transistor MI3 is turned on. Under this circumstance, the medium voltage VM is provided to the node a2 and the first output terminal CL.

As mentioned above, when the non-volatile memory is in the program mode and the voltage switch circuit 100 is connected to the non-selected memory cell, the transistor MI2 and the transistor Mr2 are turned off and the transistor Mr5 is turned on. Consequently, the low logic level voltage (e.g. 0V) is provided to the second output terminal EL. Moreover, since the transistor Mx and the transistor MI3 are turned on, the medium voltage VM is provided to the node a2 and the first output terminal CL. In other words, the medium voltage VM outputted from the first output terminal CL and the low logic level voltage (e.g. 0V) outputted from the second output terminal EL are used as the operating voltages of the non-selected memory cell.

When the non-volatile memory is in the erase mode and the voltage switch circuit 100 is connected to the selected memory cell, the enabling signal En has the enabling voltage Ven. Consequently, the transistor MI2 and the transistor Mr2 are turned on. Since the second voltage source Vpp2 provides the medium voltage VM, the transistor MI3 is turned off. Moreover, since the third voltage source Vpp3 provides the control voltage Vctrl, the transistor Mr3 is turned on.

Moreover, the first control signal Vc1, the second control signal Vc2, the third control signal Vc3 and the fourth control signal Vc4 of the first control circuit 110 have the first level voltage Vh, the second level voltage Vl, the first level voltage Vh and the second level voltage Vl, respectively. Consequently, the transistor Mc1 and the transistor Mc3 are turned off, and the transistor Mc2 and the transistor Mc4 are turned on. Since the transistor Mc2 is turned on, the high voltage VPP is received by the node a1. Under this circumstance, the transistor MI1 is turned off. Moreover, since the transistor Mc4 is turned on, the node b1 is connected with the node a2.

Moreover, the first input signal In1, the erase signal Ers and the read signal Rd of the second control circuit 120 have the high logic level voltage VDD, the high logic level voltage VDD and the low logic level voltage (e.g. 0V), respectively. Consequently, in the second control circuit 120, only the transistor MI5 is turned on. Under this circumstance, the low logic level voltage (e.g. 0V) is provided to the first output terminal CL. Moreover, since the gate voltage of transistor MI3 is VM, the node a2 is also around VM due to gate coupling effect, and the medium voltage VM is received by the node b1. Under this circumstance, the transistor Mr1 is turned on.

As mentioned above, when the non-volatile memory is in the erase mode and the voltage switch circuit 100 is connected to the selected memory cell, the transistors Mr1, Mr2 and Mr3 are turned on. Consequently, the high voltage VPP is provided to the node b2 and the second output terminal EL. Since the transistor MI5 is turned on, the low logic level voltage (e.g. 0V) is provided to the first output terminal CL. In other words, the low logic level voltage (e.g. 0V) outputted from the first output terminal CL and the high voltage VPP outputted from the second output terminal EL are used as the operating voltages of the selected memory cell.

On the other hand, when the non-volatile memory is in the erase mode and the voltage switch circuit 100 is connected to the non-selected memory cell, the enabling signal En has a disabling voltage Vdis. Consequently, the transistor MI2 and the transistor Mr2 are turned off. Since the second voltage source Vpp2 provides the medium voltage VM, the transistor MI3 is turned off. Moreover, since the third voltage source Vpp3 provides the control voltage Vctrl, the transistor Mr3 is turned off. Since the transistor Mr2 and the transistor Mr3 are turned off, the node b2 is in the floating state FL.

Moreover, the first control signal Vc1, the second control signal Vc2, the third control signal Vc3 and the fourth control signal Vc4 of the first control circuit 110 have the first level voltage Vh, the second level voltage Vl, the first level voltage Vh and the second level voltage Vl, respectively. Consequently, the transistor Mc1 and the transistor Mc3 are turned off, and the transistor Mc2 and the transistor Mc4 are turned on. Since the transistor Mc2 is turned on, the high voltage VPP is received by the node a1. Under this circumstance, the transistor MI1 is turned off. Moreover, since the transistor Mc4 is turned on, the node b1 is connected with the node a2 to receive the medium voltage VM. Under this circumstance, the transistor Mr1 is turned on.

Moreover, the first input signal In1, the erase signal Ers and the read signal Rd of the second control circuit 120 have the low logic level voltage (e.g. 0V), the high logic level voltage VDD and the low logic level voltage (e.g. 0V), respectively. Under this circumstance, the transistors MI5 and Mr5 are turned on. Consequently, the low logic level voltage (e.g. 0V) is provided to the first output terminal CL and the second output terminal EL.

Moreover, since the second output terminal EL has the ground voltage (0V), the transistor Mx is turned on and the node a2 and the node b1 have the medium voltage VM.

As mentioned above, when the non-volatile memory is in the erase mode and the voltage switch circuit 100 is connected to the non-selected memory cell, the transistors MI5 and Mr5 are turned on. Consequently, the low logic level voltage (e.g. 0V) is provided to the first output terminal CL and the second output terminal EL. In other words, the low logic level voltage (e.g. 0V) outputted from the first output terminal CL and the low logic level voltage (e.g. 0V) outputted from the second output terminal EL are used as the operating voltages of the non-selected memory cell.

When the non-volatile memory is in the read mode and the voltage switch circuit 100 is connected to the selected memory cell or the non-selected memory cell, all of the first voltage source Vpp1, the second voltage source Vpp2, the third voltage source Vpp3 and the enabling signal En provide the high logic level voltage VDD, and the fourth voltage source Vpp4 provide the ground voltage (0V). Consequently, the transistors MI2, Mr2, MI3 and Mr3 are turned off.

Moreover, the first control signal Vc1, the second control signal Vc2, the third control signal Vc3 and the fourth control signal Vc4 of the first control circuit 110 are in a floating state FL. Consequently, the transistor MI1 and the transistor Mr1 are turned off. Under this circumstance, the nodes a1, a2, b1 and b2 are in the floating state FL.

Moreover, the first input signal In1, the erase signal Ers and the read signal Rd of the second control circuit 120 have the high logic level voltage VDD, the low logic level voltage (e.g. 0V) and the high logic level voltage VDD, respectively. Under this circumstance, the transistors MI6 and Mr6 are turned on. Consequently, the read voltage VPR is provided to the first output terminal CL and the second output terminal EL.

As mentioned above, when the non-volatile memory is in the read mode and the voltage switch circuit 100 is connected to the selected memory cell or the non-selected memory cell, the read voltage VPR is provided to the first output terminal CL and the second output terminal EL. In other words, the read voltage VPR outputted from the first output terminal CL and the read voltage VPR outputted from the second output terminal EL are used as the operating voltages of the selected memory cell or the non-selected memory cell.

Figure 2:
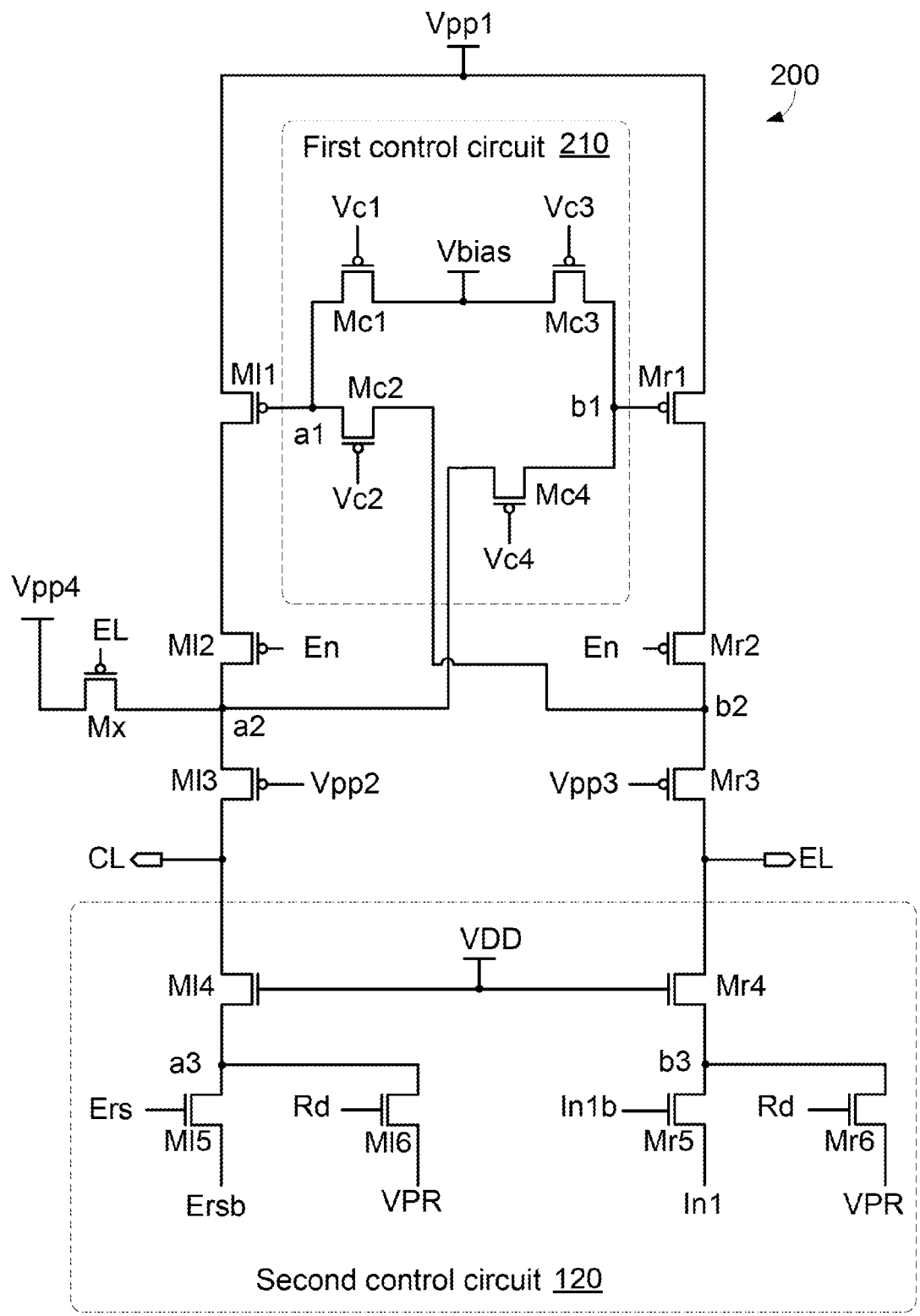
FIG. 2 is a schematic circuit diagram illustrating a voltage switch circuit according to a second embodiment of the present invention.

FIG. 2 is a schematic circuit diagram illustrating a voltage switch circuit according to a second embodiment of the present invention. In comparison with the voltage switch circuit 100 of the first embodiment, the connecting relationships between the transistor Mc2 of the first control circuit 210 and associated components of the voltage switch circuit 200 of this embodiment are distinguished. The connecting relationships between other components of the voltage switch circuit 200 of this embodiment are similar to those of the first embodiment, and are not redundantly described herein. In the first control circuit 210, the source terminal of the transistor Mc2 is connected to the node b2, the gate terminal of the transistor Mc2 receives the second control signal Vc2, and the drain terminal of the transistor Mc2 is connected to the node a1.

Moreover, the operating voltages of the voltage switch circuit 200 of this embodiment in various operating modes are similar to those of FIG. 1B, and are not redundantly described herein.

From the above descriptions, the present invention provides a voltage switch circuit for a non-volatile memory. According to the operating mode of the non-volatile memory, corresponding operating voltages are provided from the voltage switch circuit to the memory cell array of the non-volatile memory.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage switch circuit connected to a memory cell of a non-volatile memory, the voltage switch circuit comprising:
 a first transistor, wherein a source terminal of the first transistor is connected to a first voltage source, and a gate terminal of the first transistor is connected to a node a1;
 a second transistor, wherein a source terminal of the second transistor is connected to the first voltage source, and a gate terminal of the second transistor is connected to a node b1;
 a third transistor, wherein a source terminal of the third transistor is connected to a drain terminal of the first transistor, a gate terminal of the third transistor receives an enabling signal, and a drain terminal of the third transistor is connected to a node a2;
 a fourth transistor, wherein a source terminal of the fourth transistor is connected to a drain terminal of the second transistor, a gate terminal of the fourth transistor receives the enabling signal, and a drain terminal of the fourth transistor is connected to a node b2;
 a fifth transistor, wherein a source terminal of the fifth transistor is connected to the node a2, a gate terminal of the fifth transistor is connected to a second voltage source, and a drain terminal of the fifth transistor is connected to a first output terminal;

a sixth transistor, wherein a source terminal of the sixth transistor is connected to the node b2, a gate terminal of the sixth transistor is connected to a third voltage source, and a drain terminal of the sixth transistor is connected to a second output terminal;

a seventh transistor, wherein a source terminal of the seventh transistor is connected to a fourth voltage source, a gate terminal of the seventh transistor is connected to the second output terminal, and a drain terminal of the seventh transistor is connected to the node a2;

a first control circuit connected to the node a1, the node b1 and the node a2; and a second control circuit connected to the first output terminal and the second output terminal, wherein in a program mode and an erase mode of the non-volatile memory, the first voltage source provides a high voltage, the second voltage source provides a medium voltage or a ground voltage, the third voltage source provides a control voltage, and the fourth voltage source provides the medium voltage, wherein in a read mode of the non-volatile memory, all of the first voltage source, the second voltage source and the third voltage source provide a high logic level voltage, and the fourth voltage source provides the ground voltage, wherein the high voltage is higher than the medium voltage, the medium voltage is higher than the high logic level voltage, and the control voltage is in a range between the medium voltage and the high voltage.

2. The voltage switch circuit as claimed in claim 1, wherein the first control circuit comprises:

an eighth transistor, wherein a source terminal of the eighth transistor receives a bias voltage, a gate terminal of the eighth transistor receives a first control signal, and a drain terminal of the eighth transistor is connected to the node a1;

a ninth transistor, wherein a source terminal of the ninth transistor is connected to the first voltage source, a gate terminal of the ninth transistor receives a second control signal, and a drain terminal of the ninth transistor is connected to the node a1;

a tenth transistor, wherein a source terminal of the tenth transistor receives the bias voltage, a gate terminal of the tenth transistor receives a third control signal, and a drain terminal of the tenth transistor is connected to the node b1; and an eleventh transistor, wherein a source terminal of the eleventh transistor is connected to the node a2, a gate terminal of the eleventh transistor receives a fourth control signal, and a drain terminal of the eleventh transistor is connected to the node b1, wherein the high voltage is higher than the bias voltage.

3. The voltage switch circuit as claimed in claim 2, wherein when the non-volatile memory is in the program mode and the memory cell is a selected memory cell, the first transistor and the second transistor are turned on according to the bias voltage, the third transistor and the fourth transistor are turned on according to an enabling voltage of the enabling signal, the fifth transistor is turned on according to the medium voltage, the sixth transistor is turned on according to the control voltage, and the second control circuit is inactivated, so that the high voltage is outputted from the first output terminal and the second output terminal, wherein the enabling voltage is lower than the high voltage.

4. The voltage switch circuit as claimed in claim 2, wherein when the non-volatile memory is in the program mode and the memory cell is a non-selected memory cell, the first transistor and the second transistor are turned on according to the bias voltage, the third transistor and the fourth transistor are turned off according to a disabling voltage of the enabling signal, the fifth transistor is turned on according to the ground voltage, the sixth transistor is turned off according to the control voltage, and the second control circuit provides a low logic level voltage to the second output terminal, so that the seventh transistor is turned on and the medium voltage is outputted from the first output terminal, wherein the disabling voltage is lower than or equal to the high voltage.

5. The voltage switch circuit as claimed in claim 2, wherein when the non-volatile memory is in the erase mode and the memory cell is a selected memory cell, the first transistor is turned off according to the high voltage, the second transistor is turned on, the third transistor and the fourth transistor are turned on according to an enabling voltage of the enabling signal, the fifth transistor is turned off according to the medium voltage, the sixth transistor is turned on according to the control voltage, and the second control circuit provides a low logic level voltage to the first output terminal, so that the low logic level voltage is outputted from the first output terminal and the high voltage is outputted from the second output terminal, wherein the enabling voltage is lower than the high voltage.

6. The voltage switch circuit as claimed in claim 2, wherein when the non-volatile memory is in the erase mode and the memory cell is a non-selected memory cell, the first transistor is turned off according to the high voltage, the second transistor is turned on, the third transistor and the fourth transistor are turned off according to a disabling voltage of the enabling signal, the fifth transistor is turned off according to the medium voltage, the sixth transistor is turned off according to the control voltage, and the second control circuit provides a low logic level voltage to the first output terminal and the second output terminal, so that the low logic level voltage is outputted from the first output terminal and the second output terminal and the seventh transistor is turned on, wherein the disabling voltage is lower than or equal to the high voltage.

7. The voltage switch circuit as claimed in claim 2, wherein when the non-volatile memory is in the read mode, the first transistor and the second transistor are turned off, the enabling signal has the high logic level voltage, the third transistor and the fourth transistor are turned off according to the enabling signal, the fifth transistor and the sixth transistor are turned off according to the high logic level voltage, and the second control circuit provides a read voltage to the first output terminal and the second output terminal, so that the read voltage is outputted from the first output terminal and the second output terminal.

8. The voltage switch circuit as claimed in claim 1, wherein the second control circuit comprises:

a twelfth transistor, wherein a drain terminal of the twelfth transistor is connected to the first output terminal, a gate terminal of the twelfth transistor receives the high logic level voltage, and a source terminal of the twelfth transistor is connected to a node a3;

a thirteen transistor, wherein a drain terminal of the thirteen transistor is connected to the second output terminal, a gate terminal of the thirteen transistor receives the high logic level voltage, and a source terminal of the thirteen transistor is connected to a node b3;

a fourteenth transistor, wherein a drain terminal of the fourteenth transistor is connected to the node a3, a gate terminal of the fourteenth transistor receives an erase signal, and a source terminal of the fourteenth transistor receives an inverted erase signal;

a fifteenth transistor, wherein a drain terminal of the fifteenth transistor is connected to the node a3, a gate terminal of the fifteenth transistor receives a read signal, and a source terminal of the fifteenth transistor receives a read voltage;

a sixteenth transistor, wherein a drain terminal of the sixteenth transistor is connected to the node b3, a source terminal of the sixteenth transistor receives a first input signal, and a gate terminal of the sixteenth transistor receives an inverted first input signal; and a seventeenth transistor, wherein a drain terminal of the seventeenth transistor is connected to the node b3, a gate terminal of the seventeenth transistor receives the read signal, and a source terminal of the seventeenth transistor receives the read voltage.

9. The voltage switch circuit as claimed in claim 8, wherein when the non-volatile memory is in the program mode and the memory cell is a selected memory cell, the first input signal has the high logic level voltage, and the erase signal and the read signal have a low logic level voltage, so that the fourteenth transistor, the fifteenth transistor, the sixteenth transistor and the seventeenth transistor are turned off.

10. The voltage switch circuit as claimed in claim 8, wherein when the non-volatile memory is in the program mode and the memory cell is a non-selected memory cell, the first input signal, the erase signal and the read signal have a low logic level voltage, so that the sixteenth transistor is turned on and the fourteenth transistor, the fifteenth transistor and the seventeenth transistor are turned off.

11. The voltage switch circuit as claimed in claim 8, wherein when the non-volatile memory is in the erase mode and the memory cell is a selected memory cell, the first input signal and the erase signal have the high logic level voltage, and the read signal have a low logic level voltage, so that the fourteenth transistor is turned on, and the fifteenth transistor, the sixteenth transistor and the seventeenth transistor are turned off.

12. The voltage switch circuit as claimed in claim 8, wherein when the non-volatile memory is in the erase mode and the memory cell is a non-selected memory cell, the erase signal have the high logic level voltage, and the first input signal and the read signal have a low logic level voltage, so that the fourteenth transistor and the sixteenth transistor are turned on and the fifteenth transistor and the seventeenth transistor are turned off.

13. The voltage switch circuit as claimed in claim 8, wherein when the non-volatile memory is in the read mode, the first input signal has the high logic level voltage, and the erase signal and the read signal have a low logic level voltage, so that the fifteenth transistor and the seventeenth transistor and turned on and the fourteenth transistor and the sixteenth transistor are turned off.

14. The voltage switch circuit as claimed in claim 1, wherein the first control circuit comprises:

an eighth transistor, wherein a source terminal of the eighth transistor receives a bias voltage, a gate terminal of the eighth transistor receives a first control signal, and a drain terminal of the eighth transistor is connected to the node a1;

a ninth transistor, wherein a source terminal of the ninth transistor is connected to the node b2, a gate terminal of the ninth transistor receives a second control signal, and a drain terminal of the ninth transistor is connected to the node a1;

a tenth transistor, wherein a source terminal of the tenth transistor receives the bias voltage, a gate terminal of the tenth transistor receives a third control signal, and a drain terminal of the tenth transistor is connected to the node b1; and an eleventh transistor, wherein a source terminal of the eleventh transistor is connected to the node a2, a gate terminal of the eleventh transistor receives a fourth control signal, and a drain terminal of the eleventh transistor is connected to the node b1, wherein the high voltage is higher than the bias voltage.

15. The voltage switch circuit as claimed in claim 14, wherein when the non-volatile memory is in the program mode and the memory cell is a selected memory cell, the first transistor and the second transistor are turned on according to the bias voltage, the third transistor and the fourth transistor are turned on according to an enabling voltage of the enabling signal, the fifth transistor is turned on according to the medium voltage, the sixth transistor is turned on according to the control voltage, and the second control circuit is inactivated, so that the high voltage is outputted from the first output terminal and the second output terminal, wherein the enabling voltage is lower than the high voltage.

16. The voltage switch circuit as claimed in claim 14, wherein when the non-volatile memory is in the program mode and the memory cell is a non-selected memory cell, the first transistor and the second transistor are turned on according to the bias voltage, the third transistor and the fourth transistor are turned off according to a disabling voltage of the enabling signal, the fifth transistor is turned on according to the ground voltage, the sixth transistor is turned off according to the control voltage, and the second control circuit provides a low logic level voltage to the second output terminal, so that the seventh transistor is turned on and the medium voltage is outputted from the first output terminal, wherein the disabling voltage is lower than or equal to the high voltage.

17. The voltage switch circuit as claimed in claim 14, wherein when the non-volatile memory is in the erase mode and the memory cell is a selected memory cell, the first transistor is turned off according to the high voltage, the second transistor is turned on, the third transistor and the fourth transistor are turned on according to an enabling voltage of the enabling signal, the fifth transistor is turned off according to the medium voltage, the sixth transistor is turned on according to the control voltage, and the second control circuit provides a low logic level voltage to the first output terminal, so that the low logic level voltage is outputted from the first output terminal and the high voltage is outputted from the second output terminal, wherein the enabling voltage is lower than the high voltage.

18. The voltage switch circuit as claimed in claim 14, wherein when the non-volatile memory is in the erase mode and the memory cell is a non-selected memory cell, the first transistor is turned off, the second transistor is turned on, the third transistor and the fourth transistor are turned off according to a disabling voltage of the enabling signal, the fifth transistor is turned off according to the medium voltage, the sixth transistor is turned off according to the control voltage, and the second control circuit provides a low logic level voltage to the first output terminal and the second output terminal, so that the low logic level voltage is outputted from the first output terminal and the second output terminal and the seventh transistor is turned on, wherein the disabling voltage is lower than or equal to the high voltage.

19. The voltage switch circuit as claimed in claim 14, wherein when the non-volatile memory is in the read mode, the first transistor and the second transistor are turned off, the enabling signal has the high logic level voltage, the third transistor and the fourth transistor are turned off according to the enabling signal, the fifth transistor and the sixth transistor are turned off according to the high logic level voltage, and the second control circuit provides a read voltage to the first output terminal and the second output terminal, so that the read voltage is outputted from the first output terminal and the second output terminal.

* * * * *